US009482731B2

(12) United States Patent
Grodzki

(10) Patent No.: US 9,482,731 B2
(45) Date of Patent: Nov. 1, 2016

(54) DYNAMIC ADJUSTMENT OF GRADIENT RISE TIMES FOR MR HF PULSE SEQUENCES

(71) Applicant: David Grodzki, Erlangen (DE)

(72) Inventor: David Grodzki, Erlangen (DE)

(73) Assignee: Siemens Aktiengesellschaft, München (DE)

( * ) Notice: Subject to any disclaimer, the term of this patent is extended or adjusted under 35 U.S.C. 154(b) by 638 days.

(21) Appl. No.: 13/948,169

(22) Filed: Jul. 22, 2013

(65) Prior Publication Data
US 2014/0021950 A1 Jan. 23, 2014

(30) Foreign Application Priority Data

Jul. 23, 2012 (DE) .................. 10 2012 212 877

(51) Int. Cl.
| | | |
|---|---|---|
| G01R 33/48 | (2006.01) | |
| G01R 33/42 | (2006.01) | |
| G01R 33/483 | (2006.01) | |
| G01R 33/385 | (2006.01) | |

(52) U.S. Cl.
CPC ........... *G01R 33/42* (2013.01); *G01R 33/4833* (2013.01); *G01R 33/3854* (2013.01); *G01R 33/4816* (2013.01)

(58) Field of Classification Search
CPC ............................. G01R 33/42; G01R 33/4833
See application file for complete search history.

(56) References Cited

U.S. PATENT DOCUMENTS

| | | | | |
|---|---|---|---|---|
| 5,587,658 A | * | 12/1996 | Sukumar | ............ G01R 33/3875 324/307 |
| 6,452,391 B1 | | 9/2002 | Bernstein et al. | |
| 2013/0265050 A1 | * | 10/2013 | Grodzki | ............ G01R 33/4806 324/309 |

FOREIGN PATENT DOCUMENTS

JP 2008302102 12/2008

OTHER PUBLICATIONS

Bracher A.-K. et al; "Center-Acquisition-at-Partial-Ramp Imaging (CAPRI) for the Reduciton of Off-Resonance and T2 Induced Blurring Artifacts"; Proc. Intl. Soc. Mag. Reson. Med 20 (2012); p. 2294; 2012.
German Office Action dated Apr. 11, 2013 for corresponding German Patent Application No. DE 10 2012 212 877.8 with English translation.
Grodzki D.M. et. al.; Ultrashort echo time imaging using pointwise encoding time reduction with radial acquisition (PETRA); Magn. Reson Med. 67; pp. 510-518, doi: 10.1002/mrm.23017. Epub Jun. 30, 2011; 2012.
Heid/Deimling: "Rapid Single Point (RASP) Imaging", SMR, 3rd Annual Meeting, p. 684, 1995; 1995.
Park J.-Y. et al; "Short Echo-Time 3D Radial Gradient-Echo MRI Using Concurrent Dephasing and Excitation"; Magnetic Resonance in Medicine 67; pp. 428-436; 2012.

(Continued)

*Primary Examiner* — G. M. Hyder
(74) *Attorney, Agent, or Firm* — Lempia Summerfield Katz LLC

(57) ABSTRACT

In a method for image data acquisition using a magnetic resonance system, in order to excite nuclear spin signals, a sequence of high-frequency pulses is irradiated into an examination subject while gradients are simultaneously switched for position encoding of the excited nuclear spin signals. The rise times of the gradients used during the sequence are adjusted dynamically with each high-frequency pulse irradiation.

14 Claims, 2 Drawing Sheets

(56) References Cited

OTHER PUBLICATIONS

Sonia Nielles-Vallesin et. al., 3D Radial Projection Technique with Ultrashort Echo Times for Sodium MRI: Clinical Applications in Human Brain and Skeletal Muscle;Magnetic Resonance in Medicine (2007), vol. 57, pp. 74-81; 2007.

Xu Dan et al; "Variable Slew-Rate Spiral Design: Theory and Application to Peak B1 Amplitude Reduction in 2D RF Pulse Design"; Magnetic Resonance in Medicine 58; pp. 835-842; 2007.

* cited by examiner

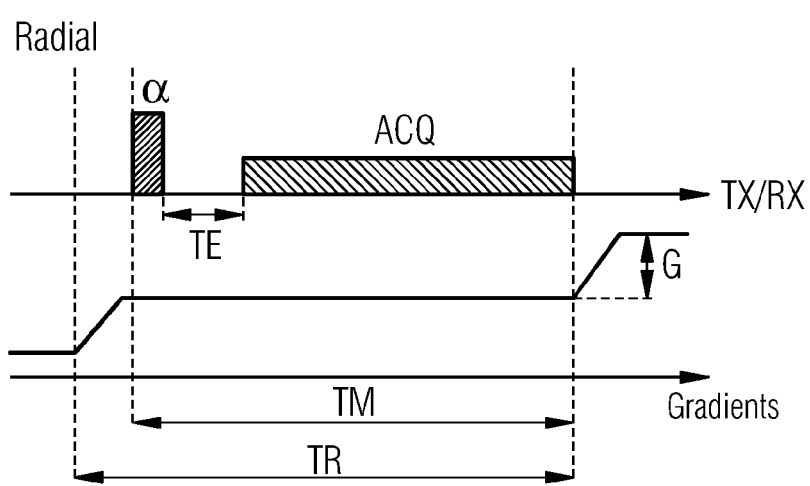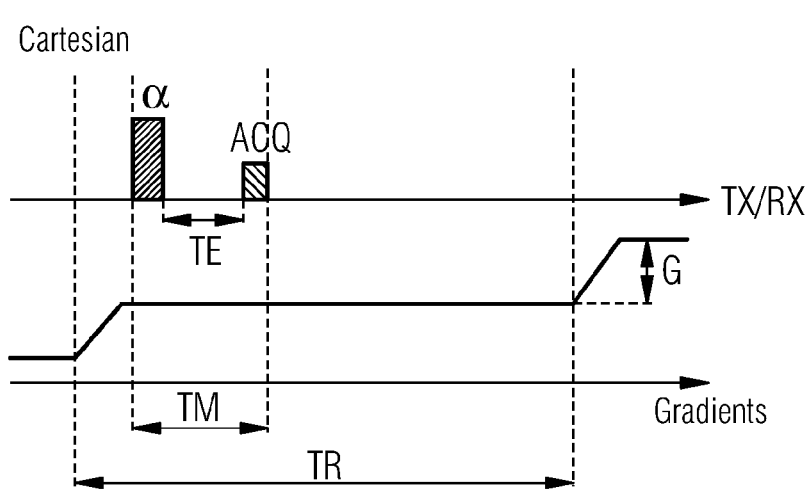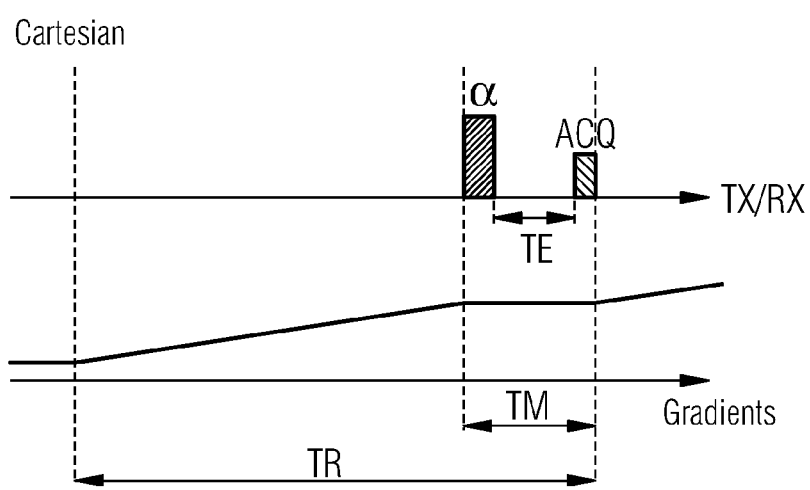

DYNAMIC ADJUSTMENT OF GRADIENT RISE TIMES FOR MR HF PULSE SEQUENCES

This application claims the benefit of DE 10 2012 212 877.8, filed on Jul. 23, 2012, which is hereby incorporated by reference.

BACKGROUND

The present embodiments relate to a method for MR image data acquisition.

Magnetic resonance (MR) technology is a known technology that enables images of the interior of an examination subject to be produced. The examination subject is positioned in a magnetic resonance unit in a comparatively strong static, homogeneous basic magnetic field (e.g., a $B_0$ field) having field strengths of 0.2 tesla to 7 tesla and more. This provides that the nuclear spins thereof are oriented along the basic magnetic field. In order to trigger nuclear spin resonances (e.g., nuclear spin signals), high-frequency excitation pulses (e.g., HF excitation pulses) or high-frequency pulses are irradiated into the examination subject, the triggered nuclear spin resonances are measured, and on the basis thereof, MR images are reconstructed or spectroscopy data is ascertained. For the purpose of position encoding of the measurement data, rapidly switched magnetic gradient fields (e.g., gradients) are superimposed on the basic magnetic field. The measurement data recorded is digitized and stored as complex numerical values in a k-space matrix. From the values contained in the k-space matrix, an associated MR image may be reconstructed, for example, by a multidimensional Fourier transform.

With regard to the triggering of the nuclear spin signals, the spins situated in the examination region are excited from the state of equilibrium by the HF excitation pulses and tilted into the transverse plane. This transverse magnetization may be measured by induction.

With regard to the excitation, selective HF excitation pulses that, for example, excite only one layer in the examination subject may be distinguished from non-selective HF excitation pulses. Non-selective HF excitation pulses may excite the entire examination subject, or at least the examination region to be examined in the examination subject, in a uniform fashion. Additional gradients are switched for the purpose of spatial resolution. For a resolution in the layer direction, for example, gradients are switched in the layer direction.

MR sequences that may use non-selective HF excitation pulses are already known. For example, a rapid signal point (RASP) sequence is an example, as is described by Heid and Deimling in "Rapid Signal Point (RASP) Imaging," SMR, 3rd Annual Meeting, p. 684, 1995. Other examples include, for example, turbo spin echo sequences or also ultrashort echo time (UTE) sequences, as is described, for example, in the paper by Sonia Nielles-Vallespin, "3D radial projection technique with ultrashort echo times for sodium MRI: Clinical applications in human brain and skeletal muscle," Magn. Res. Med. 2007, 57, pp. 74-81.

Magnetic resonance examinations may be very loud. The main reason for this is rapidly changing gradient fields that result in distortions and oscillations in the gradient coil and the transmission of this energy to the housing. In order to design a sequence that is used as quietly as possible, the changes in the gradients over time dG/dt should be as small as possible.

Certain MR sequences use imaging gradients that are already switched on at the time of the excitation. These sequences may have an ultrashort echo time. Examples are the aforementioned RASP and UTE sequences as well as single-point ramped imaging with Ti enhancement (SPRITE), sweep imaging with Fourier transofmr (SWIFT), or pointwise encoding time reduction with radial acquisition (PETRA) sequences. The PETRA sequence is known, for example, from Grodzki, D M, Jakob, P M, and Heismann, B, in "Ultrashort echo time imaging using pointwise encoding time reduction with radial acquisition (PETRA)," Magn. Reson. Med. 67(2), 510-8, Jun. 30, 2011.

The stated sequences may measure in the steady state, which the spin system reaches during the measurement given a constant flip angle and repetition time (TR). With regard to certain measurements such as, for example, anisotropic resolution or combination of different measurement trajectories, the time used for the data acquisition does, however, also change the relative gradient distances between the repetitions during the measurement.

One advantage of sequences with imaging gradients switched on for excitation purposes is that the sequences may be very quiet. The reason for this is the fact that the gradient distances between the repetitions are for the most part small, and with a sufficiently large ramp or rise duration, noises from the gradient system may be ignored or not noticed.

In order to obtain as small a noise development as possible from the gradient system, the ramp times or rise times are chosen of such a length that the ramp times and the rise times are also sufficiently large in the sequence regions having greater gradient distances between the repetitions and a maximum data acquisition duration. The minimum possible repetition time thus increases.

SUMMARY AND DESCRIPTION

The scope of the present invention is defined solely by the appended claims and is not affected to any degree by the statements within this summary.

The present embodiments may obviate one or more of the drawbacks or limitations in the related art. For example, an improved method for magnetic resonance (MR) image data acquisition with as little noise development as possible is provided.

In one or more of the present embodiments, a method for image data acquisition using a magnetic resonance system, in which in order to excite nuclear spin signals, a sequence of high-frequency pulses is irradiated into an examination subject (e.g., a patient), while gradients are simultaneously switched for position encoding of the excited nuclear spin signals. Rise times of the gradients used during the sequence are adjusted dynamically with each high-frequency pulse irradiation.

In other words, the ramp times used during the sequence are not kept constant but are optimized for each repetition (e.g., with each high-frequency pulse irradiation).

With each high-frequency pulse irradiation, the rise times may be adjusted such that the gradients exhibit a constant value only during the period of time from the start of pulse of the high-frequency pulse to the end of image data acquisition, and the remaining time is used as rise time.

According to one or more of the present embodiments, ramp times that are non-constant but are of optimum length for each repetition or repeat are used throughout the measurement. In this situation, the gradients may be configured such that the gradients exhibit a constant value only during the period of time from the start of pulse to the end of data acquisition, and the remaining time is used for "ramping".

An advantageous embodiment provides that after the start of pulse of a high-frequency pulse, essentially only one raw data point is captured in a k-space data set associated with the image data acquisition. The k-space data set is filled line by line with raw data points captured from the sequence.

In other words, the approach according to one or more of the present embodiments is applied to the Cartesian acquisition part of the sequence. In this case, the sequence may include a radial and a Cartesian acquisition part. A PETRA sequence may be used as the sequence.

A further aspect is a magnetic resonance system including a basic field magnet, a gradient field system, a high-frequency antenna and a control unit for driving the gradient field system and the high-frequency antenna. The control unit is also configured for receiving measurement signals captured by the high-frequency antenna, for evaluating the measurement signals and for producing magnetic resonance images. The magnetic resonance system is configured to carry out the method described herein.

One embodiment of a computer program may be loaded directly into a non-transitory memory (e.g., a non-transitory computer-readable medium) of a programmable control unit (e.g., a processor) of a magnetic resonance system, and includes program resources for executing all the acts of the method described herein when the program is executed in the control unit of the magnetic resonance system.

An electronically readable data medium (e.g., a non-transitory computer-readable medium) according to one or more of the present embodiments includes electronically readable control information (e.g., instructions) stored thereon that is configured to carry out the method described herein when the data medium is used in a control unit of a magnetic resonance system.

The advantages and embodiments stated with reference to the method apply analogously to the magnetic resonance system, the computer program product and the electronically readable data medium.

The present embodiments have the following advantages: significantly lower noise development in otherwise loud sequence regions; optimum utilization of the time available for gradient activities; and reduced stimulation of the patient on account of reduced dB/dt values.

BRIEF DESCRIPTION OF THE DRAWINGS

FIG. 2 schematically illustrates a part of one embodiment of a sequence for acquiring a plurality of raw data points on a radial k-space trajectory;

FIG. 3 schematically illustrates a part of one embodiment of a sequence for acquiring a plurality of raw data points on a Cartesian k-space trajectory; and FIG. 4 schematically illustrates a part of one embodiment of a sequence for acquiring a plurality of raw data points on a Cartesian k-space trajectory as may be used in conjunction with the method.

DETAILED DESCRIPTION

Figure 1:
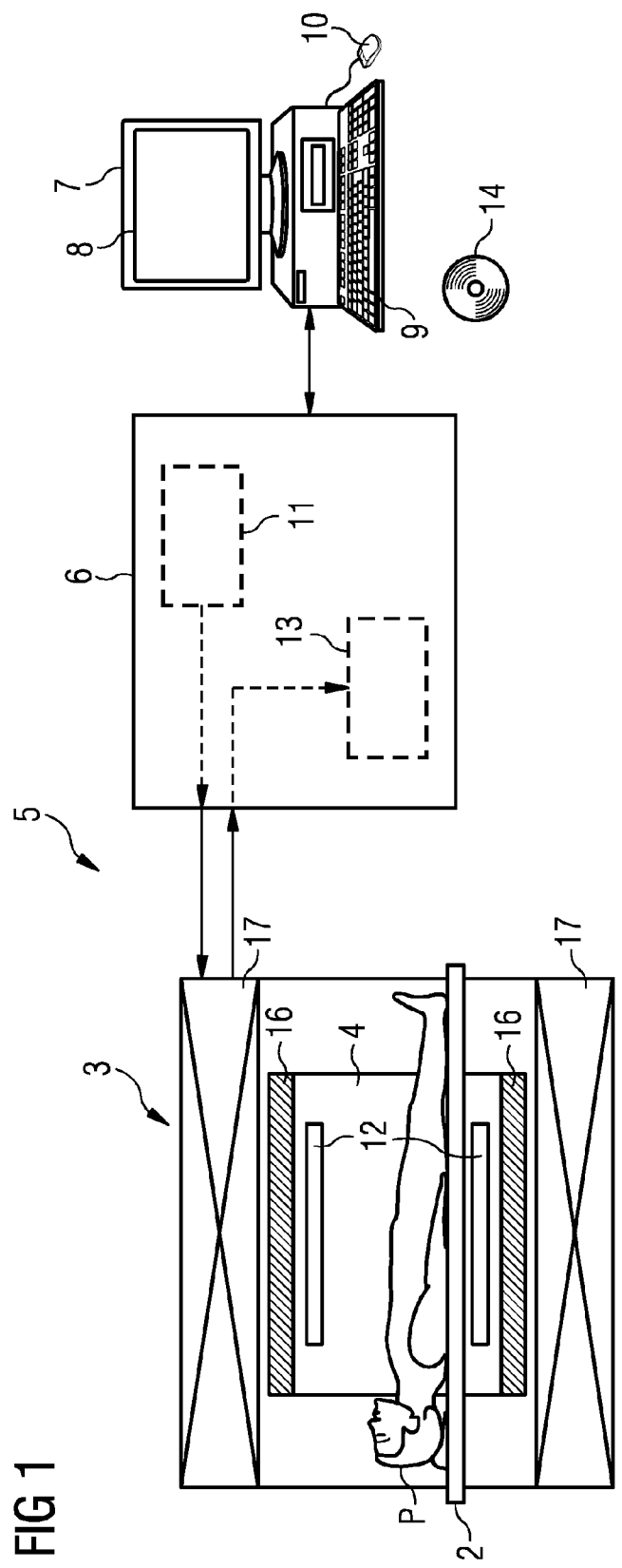
FIG. 1 schematically illustrates an example of a magnetic resonance system.

FIG. 1 schematically illustrates one embodiment of a magnetic resonance system 5. The magnetic resonance system 5 includes a tomograph 3 having a basic field magnet unit 17, and a gradient system 16, by which a magnetic field including a gradient field (e.g., gradients in FIGS. 2, 3, 4) used for magnetic resonance (MR) examination is generated in a measurement chamber 4. The magnetic resonance system 5 also includes a send/receive device 12 for sending high frequency (HF) excitation pulses and capturing echo signals, a table 2, a control unit 6, by which the tomograph 3 is controlled and raw data is acquired by the tomograph 3, and a terminal 7 connected to the control unit 6.

The control unit 6 includes a drive unit 11 and an evaluation device 13. During the production of an image data set, echo signals are acquired by the tomograph 3 from the send and receive device 12 that is configured as a high-frequency antenna, and the send TX and receive duration RX of which is indicated in FIGS. 2 to 4. The tomograph 3 and the table 2 are driven by the drive unit 11 such that MR data is acquired in an imaging region that is situated inside the body of a patient P lying on the table 2.

The evaluation device 13 acquires the captured echo signals as raw data and stores and processes the raw data. For example, the evaluation device 13 employs reconstruction to process the raw data that is read out such that the processed raw data may be represented graphically on a display unit 8 (e.g., on a screen 8) of the terminal 7, and images produced according to one or more of the present embodiments are displayed. In addition to the graphical representation of the image data reconstructed from the raw data, a user, when using the terminal 7, which in addition to the screen 8, includes an input device such as, for example a keyboard 9 and/or a computer mouse 10, may predetermine a three-dimensional volume section that is to be measured as an imaging region and define further parameters for carrying out the method according to one or more of the present embodiments. The software for the control unit 6 may be loaded into the control unit 6 via the terminal 7. The software for the control unit 6 may also execute one of the methods of the present embodiments. In one embodiment, one of the methods according to one or more of the present embodiments is contained in a piece of software that runs in the terminal 7. Regardless of which software the method is contained in, the software may be stored on an electronically readable data medium (e.g., a non-transitory computer-readable storage medium) such as, for example, a DVD 14 (e.g., the software may be read by the terminal 7 from the DVD 14 and may be copied either into the control unit 6 or into a computing unit of the terminal 7).

The approach according to one or more of the present embodiments will be described in detail on the basis of FIGS. 2, 3 and 4 with reference to the pointwise encoding time reduction with radial acquisition (PETRA) sequence.

The PETRA sequence includes a radial and a Cartesian acquisition part. In the radial acquisition part, as is shown, for example, in FIG. 2, a half-projection is captured by the k-space. In the Cartesian part, as illustrated in FIG. 3, only a single point is read out. After the ramp phase (e.g., ramp time) of the gradients, a particular flip angle is applied, and the readout is started in echo time TE. The time TM required in a repetition or repeat for the measurement operation, which corresponds to the sum of pulse duration a, echo time TE and readout duration ACQ, is therefore significantly shorter in the Cartesian part, as illustrated in FIGS. 2 and 3.

The gradient amplitude differences AG on scanning the Cartesian points in the Cartesian part of the sequence are significantly greater than in the radial part. If the same ramp time is used over the sequence, the dG/dt times in the Cartesian part are greater. Noises or even a shaking of the table may be produced as a result.

According to one or more of the present embodiments, the ramp times are extended to a maximum value. With the shortest possible repetition time TR, this is already the case in the radial part, but in the Cartesian part, the ramp time may be significantly extended, as FIG. 4 shows. With the approach according to one or more of the present embodiments, in the example of the PETRA sequence, noise generation may also be prevented in the Cartesian part, and the shaking of the table may be reduced to a minimum.

It is to be understood that the elements and features recited in the appended claims may be combined in different ways to produce new claims that likewise fall within the scope of the present invention. Thus, whereas the dependent claims appended below depend from only a single independent or dependent claim, it is to be understood that these dependent claims can, alternatively, be made to depend in the alternative from any preceding or following claim, whether independent or dependent, and that such new combinations are to be understood as forming a part of the present specification.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A method for image data acquisition using a magnetic resonance system, the method comprising:
   irradiating, in order to excite nuclear spin signals, a sequence of high-frequency pulses into an examination subject while gradients are simultaneously switched for position encoding of the nuclear spin; and
   adjusting rise times of the gradients used during the sequence dynamically with each high-frequency pulse irradiation of the sequence.

2. The method as claimed in claim 1, wherein adjusting the rise times comprises adjusting, with each high-frequency pulse irradiation, the rise times such that the gradients exhibit a constant value only during a period of time from a start of pulse of the high-frequency pulse to an end of image data acquisition, and the remaining time is used as the rise time.

3. The method as claimed in claim 2, wherein a pointwise encoding time reduction with radial acquisition (PETRA) sequence is used as the sequence.

4. The method as claimed in claim 2, further comprising:
   capturing, after the start of pulse of the high-frequency pulse, essentially only one raw data point in a k-space data set associated with the image data acquisition; and
   filling the k-space data set line by line with raw data points captured from the sequence.

5. The method as claimed in claim 4, wherein a pointwise encoding time reduction with radial acquisition (PETRA) sequence is used as the sequence.

6. The method as claimed in claim 1, wherein a pointwise encoding time reduction with radial acquisition (PETRA) sequence is used as the sequence.

7. A magnetic resonance system comprising:
   a basic field magnet;
   a gradient field system;
   a high-frequency antenna; and
   a control unit configured to:
      drive the gradient field system and the high-frequency antenna to irradiate, in order to excite nuclear spin signals, a sequence of high-frequency pulses into an examination subject while gradients are simultaneously switched for position encoding of the nuclear spin;
      adjust rise times of gradients of the gradient field system dynamically with each high-frequency pulse irradiation of the sequence;
      receive measurement signals captured by the high-frequency antenna;
      evaluate the measurement signals; and produce magnetic resonance images.

8. A computer program product that is loadable directly into a non-transitory computer-readable storage medium of a programmable control unit of a magnetic resonance system, the computer program product including instructions for image data acquisition using the magnetic resonance system, the instructions being executable by the programmable control unit to:
   irradiate, in order to excite nuclear spin signals, a sequence of high-frequency pulses into an examination subject while gradients are simultaneously switched for position encoding of the nuclear spin; and
   adjust rise times of the gradients used during the sequence dynamically with each high-frequency pulse irradiation of the sequence.

9. In a non-transitory computer-readable storage medium that stores instructions executable by one or more processors to acquire image data using a magnetic resonance system, the instructions comprising:
   irradiating, in order to excite nuclear spin signals, a sequence of high-frequency pulses into an examination subject while gradients are simultaneously switched for position encoding of the nuclear spin; and
   adjusting rise times of the gradients used during the sequence dynamically with each high-frequency pulse irradiation of the sequence.

10. The non-transitory computer-readable storage medium as claimed in claim 9, wherein adjusting the rise times comprises adjusting, with each high-frequency pulse irradiation, the rise times such that the gradients exhibit a constant value only during a period of time from a start of pulse of the high-frequency pulse to an end of image data acquisition, and the remaining time is used as the rise time.

11. The non-transitory computer-readable storage medium as claimed in claim 10, wherein the instructions further comprise:
   capturing, after the start of pulse of the high-frequency pulse, essentially only one raw data point in a k-space data set associated with the image data acquisition; and
   filling the k-space data set line by line with raw data points captured from the sequence.

12. The non-transitory computer-readable storage medium as claimed in claim 10, wherein a pointwise encoding time reduction with radial acquisition (PETRA) sequence is used as the sequence.

13. The non-transitory computer-readable storage medium as claimed in claim 11, wherein a pointwise encoding time reduction with radial acquisition (PETRA) sequence is used as the sequence.

14. The non-transitory computer-readable storage medium as claimed in claim 9, wherein a pointwise encoding time reduction with radial acquisition (PETRA) sequence is used as the sequence.

* * * * *